United States Patent
Cai et al.

(10) Patent No.: US 6,870,213 B2
(45) Date of Patent: *Mar. 22, 2005

(54) EEPROM DEVICE WITH SUBSTRATE HOT-ELECTRON INJECTOR FOR LOW-POWER

(75) Inventors: Jin Cai, Mohegan Lake, NY (US); Tak Hung Ning, Yorktown Heights, NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 75 days.

(21) Appl. No.: 10/143,291

(22) Filed: May 10, 2002

(65) Prior Publication Data

US 2003/0209752 A1 Nov. 13, 2003

(51) Int. Cl.[7] ............................................. H01L 29/76
(52) U.S. Cl. ...................... 257/314; 257/315; 257/316; 257/317
(58) Field of Search .................... 257/314, 315, 257/316, 317; 365/185.18, 185.19, 185.26

(56) References Cited

U.S. PATENT DOCUMENTS

| | | | | |
|---|---|---|---|---|
| 5,838,617 A | * | 11/1998 | Bude et al. | 365/185.18 |
| 6,509,603 B2 | * | 1/2003 | Lin et al. | 257/315 |
| 6,614,072 B2 | * | 9/2003 | Sandhu et al. | 257/317 |
| 6,631,087 B2 | | 10/2003 | Di Pede | 365/185.18 |
| 6,734,490 B2 | * | 5/2004 | Esseni et al. | 257/315 |

* cited by examiner

*Primary Examiner*—Richard Elms
*Assistant Examiner*—Douglas M Menz
(74) *Attorney, Agent, or Firm*—George Sai-Halasz; Robert M. Trepp

(57) ABSTRACT

A low programming power, high speed EEPROM device is disclosed which is adapted for large scale integration. The device comprises a body, a source, a drain, and it has means for injecting a programming current into the body. The hot carriers from the body enter the floating gate with much higher efficiency than channel current carriers are capable of doing. The drain current of this device is controlled by the body bias. The device is built on an insulator, with a bottom common plate, and a top side body. These features make the device ideal for SOI and thin film technologies.

11 Claims, 12 Drawing Sheets

EEPROM DEVICE WITH SUBSTRATE HOT-ELECTRON INJECTOR FOR LOW-POWER

FIELD OF THE INVENTION

The present invention is related in general to semiconductor integrated circuits, and particularly to electrically erasable and programmable read-only memory (EEPROM) devices. The present invention involves the novel concepts of programming the EEPROM device with body hot-electron injection, and using the body voltage to control the drain current. The devices are specifically adapted for integration through their small footprint and low programming power consumption.

BACKGROUND OF THE INVENTION

Non-volatile memories are a large part of the microelectronics infrastructure. There is a great need for devices in which information never, or only very rarely, has to be refreshed, and are fast, small, and consume little power. Such devices, and arrays made with these devices, have been known in the art for some time. For instance, one can find information on non-volatile memories in: "Nonvolatile Semiconductor Memories, Technology, Design and Applications" Edited by Chenming Hu, IEEE Press, New York, 1991.

Electrically erasable and programmable read-only memory (EEPROM) devices are the most widely spread, and useful of all the non-volatile memories. Practically all EEPROM-s are of the floating gate type, where the presence, or absence, of a charge on a floating gate alters the threshold of the device. Thus, the information is stored in the form of charge on a floating gate. An electrically programmable device of this type has to be able to change the amount of charge on the floating gate by purely electrical means. An overview of such conventional EEPROM-s can be found in: "Endurance brightens the future of Flash, fast memory as a viable mass-storage alternative," Kurt Robinson, Electronic Component News, "Technology Horizons", November 1988.

EEPROM devices usually use channel hot-electron injection for programming in order to achieve a fast programming speed of less than 10 $\mu$sec. In such conventional devices, during programming operation a large drain-to-source voltage is applied and a large gate-to-source voltage is also applied. Electrons flowing from source to drain gain energy from the large drain voltage and become hot electrons. The large gate voltage attracts the hot electrons, which are confined mostly near the drain region, towards the gate electrode, thus causing a gate current to flow. This gate current charges up the floating gate, causing an increase in the threshold voltage of the floating gate portion of the EEPROM device.

Although the gate voltage and the drain voltage during programming are both large during channel hot electron programming, the voltage difference (Vgate−Vdrain) is usually almost zero, or slightly negative. That is, the electric field in the gate insulator does not favor the injection of hot electrons from near the drain region into the gate insulator. Consequently, only a small fraction of the hot electrons near the drain actually contribute to the gate current, making channel hot electron programming a very inefficient process. For a typical EEPROM device, the maximum ratio of gate current to channel current is in the range of $10^{-11}$ to $10^{-8}$, depending on the details of the device design and the voltages applied. With such a low programming current efficiency, typical EEPROM device requires a channel current of about 1 mA per bit during programming in order to achieve a programming speed of less than 10 $\mu$sec. The corresponding power dissipation during programming is about 5 mW per bit, assuming a drain to source voltage of 5 volt.

With such large power dissipation during programming, conventional EEPROM devices using channel hot-electrons for programming are not suitable for low power operations, particularly to battery-powered applications, where frequent reprogramming is required. As mobile and battery-operated systems are becoming more and more prevalent, there is an urgent need for EEPROM devices that dissipate relatively little power, even during programming.

SUMMARY OF THE INVENTION

In view of the above described difficulties with the current state of the art EEPROM-s, the present invention aims for several objectives to remedy the situation.

The object of this invention is a fast, low programming power, and suitable for very large scale integration (VLSI) EEPROM device.

It is another object of the present invention to teach important steps in the manufacturing methods of such EEPROM devices.

It is a further object of this invention to teach the integration of the novel EEPROM devices into memory arrays.

It is also an object of the invention to teach the integration of such EEPROM memory arrays into systems.

A common-gate (plate) EEPROM device having a substrate hot-electron injector is put forward in this invention. Also, in the new device the body voltage, instead of the gate voltage, is used to turn on and off the device channel. The common-gate configuration is conducive to the implementation of the device in SOI, or more generally, in a thin film technology.

During programming, the device body is reverse biased, and the common control gate is positively biased, with respect to the source and drain. A charge injector attached to the body causes electron injection into the device body, or substrate. As these substrate electrons drift vertically towards the gate electrode, they gain energy from the electric field caused by the reverse bias between the device body and the source and drain. The electrons with sufficient energy to surmount the silicon-$SiO_2$ energy barrier are injected into the floating gate, thus changing the threshold voltage of the EEPROM device. Since substrate hot-electrons directly impinge on the gate insulator, injection efficiency can easily be orders of magnitude higher than that during channel hot-electron injection. The injection efficiency is about $1 \times 10^{-4}$, and it takes about 1 $\mu$sec to inject enough hot electrons into the floating gate to cause a threshold voltage shift of about 1.4 V. This injection efficiency is about 4 to 7 orders of magnitude higher than the channel hot electron injection in conventional EEPROM devices. For the nominal write conditions, the injection efficiency is about $8 \times 10^{-5}$, and the write time is 1.2 $\mu$sec with a power consumption of 20 $\mu$W per bit during programming.

During erase operation, electrons in the floating gate are removed by tunneling. Depending on the device design, electrons in the floating gate can be removed by tunneling to the control gate or plate, or by tunneling back to the device body or source and drain. For example, the plate electrode can be negatively biased relative to the device body, source and drain, causing electrons to tunnel from the floating gate into the device body and source and drain. A voltage difference of 10V between the source/drain and plate during the erase operation is adequate for such a purpose.

During standby, the device body is reverse biased relative to the source and drain, causing the device to have a high threshold voltage. To read the device memory state, the device body is held at the same voltage as the source, causing the device to have a low threshold voltage.

In the fabrication of the disclosed EEPROM device an important step is a layer transfer. In such a step the device is transferred from a first wafer to a second wafer, ending in an up-side-down orientation relative to as it was on the first wafer. This step allows standard processing on both wafers, with the result that the up-side-down device provides easy access for contacting its body region, and several, or a great many, devices can share a common gate, or plate. These aspects lead to a small cell size in memory arrays.

In a memory array of the disclosed devices, the drain is connected to the bitline, the device body is connected to the wordline, while the control gate is a plate electrode.

BRIEF DESCRIPTION OF THE DRAWINGS

These and other features of the present invention will become apparent from the accompanying detailed description and drawings.

FIG. 3. shows the starting material as a silicon-on-insulator (SOI) wafer.

FIG. 16. shows the starting material comprising an SOI wafer.

DETAILED DESCRIPTION OF THE INVENTION

Figure 1:
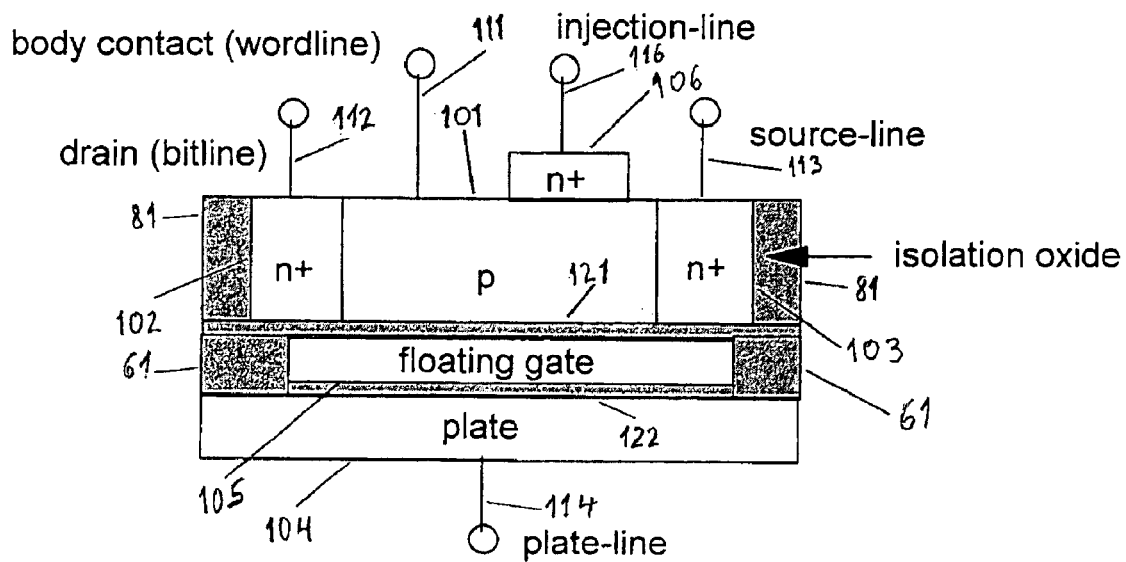
FIG. 1. shows in a cross sectional view one embodiment of the invention, a stack gate configuration EEPROM device.

An EEPROM device having a substrate hot-electron injector for high-speed and low-power programming is disclosed. This device is adapted for large scale integration. It fits with standard silicon technology processing, it is tightly packable on chips with each device having appropriate isolation. For a given linewidth capability, the size of the devices is state of the art. The control lines operating this device are similar in number and complexity to the current practice in EEPROM arrays. EEPROM arrays built with these devices can be incorporated in electronic systems practically by a simple "plug in". At the same time, such arrays inherit the low-power, high-speed advantage of the disclosed devices.

In the embodiments to be described the EEPROM body is p-type, and the programming charge is consisting essentially of electrons. However, this should not be read as a limitation on the invention. It is understood that an embodiment where the body is n-type, and consequently other regions of the device are also changed in type, and the programming charge consists essentially of holes, is within the scope of the invention. Most embodiments where the body is p-type, can also be implemented in configurations where the body is n-type.

The invented EEPROM device rests on the top of an insulating layer. The insulating layer in one embodiment is $SiO_2$, which in turn is on top of a silicon substrate. This embodiment is typical of an SOI technology. The disclosed devices are also compatible with a general thin film technology framework. In thin film technologies layers of various materials are deposited, which at times may not be of the same high quality as those of SOI technology. However, thin film technology can offer other advantages, such as cost of manufacturing.

The fabrication of the invented EEPROM device is benefitting from a layer transfer step. In such a step the device is transferred from a first substrate to a second substrate, ending in an up-side-down orientation relative to its orientation on the first substrate. This step allows standard processing steps on both substrates, with the result that the up-side-down device provides easy access for contacting its body region, while many devices can share a single gate, or plate. These aspects lead to a small cell size in a memory array.

The disclosed device differs from those in the art in that programming is done by charge injection through the body, and the device is turned on or off not by the gate, but through the body effect, by an appropriate bias on the source-body junction.

Charge injection into the body is accomplished by various injection means. In differing embodiments differing means may be used. Injecting minority carriers through a semiconductor p-n junction is one preferred embodiment. In another embodiment injection of electrons into the body can be achieved from a metal-semiconductor junction, a so called Schottky barrier junction. Yet another embodiment can use injection of carriers via tunneling across an appropriately biased thin insulating barrier.

FIG. 1 shows in a cross sectional view one embodiment of the invention, a stack gate configuration EEPROM device. In a stack gate structure the floating gate overlaps the device channel region completely.

The device rests on a plate 104, which is the control gate of the device. In the memory array the plate is contacted and controlled by the plate-line 114. In many embodiments the plate is shared by two, or by a plurality of memory cell devices. The plate is isolated from the floating gate 105 by insulator 122. Insulator 122 in a preferred embodiment is $SiO_2$. The floating gate is isolated by another insulator 121, typically $SiO_2$, from the source 103, body 101, and drain 102. Insulators 61 and 81 isolate one device from another device at the gate level and at the body level, respectively. The p-type body is contacted by an $n^+$-type electron injector 106. This arrangement is an embodiment of injection means, namely in the form of a p-n semiconductor junction. In an EEPROM memory array, besides the plate-line 114, further control lines are also contacting the device. The bitline 112 contacts the drain 102. The wordline 111 contacts the body 101, since in this device the drain current is being controlled by a voltage between the source and the body. A source-line 113 contacts the source 103, and an injection line 116 contacts the electron injector 106.

During programming, the device body 101 is reverse biased with respect to the source 103 and drain 102, the control gate 104 is positively biased with respectively to the source 103 and drain 102, and the injector 106 is forward biased with respected to the device body 101. Electrons are injected from the injector 106 into the device body 101 or substrate. As these substrate electrons drift vertically towards the gate electrode 104, they gain energy from the electric field caused by the reverse bias between the device body 101 and the source 103 and drain 102. The electrons with sufficient energy to surmount the silicon-$SiO_2$ energy barrier 121 are injected into the floating gate 105, thus changing the threshold voltage of the EEPROM device.

During erase operation, electrons in the floating gate 105 are removed by tunneling. Depending on the device design, electrons in the floating gate can be removed by tunneling to the control gate or plate 104, or by tunneling back to the device body 101 or source 103 and drain 102. For example, the plate electrode 104 can be negatively biased relative to the device body 101, source 103 and drain 102, causing electrons to tunnel from the floating gate 105 into the device body 101 and source 103 and drain 102.

During standby, the device body 101 is reverse biased relative to the source 103 and drain 102, causing the device to have a high threshold voltage. To read the device memory state, the device body 101 is held at the same voltage as the source 103, causing the device to have a low threshold voltage.

In one embodiment the p-type silicon body 101 has a uniform doping concentration of $1\times10^{17}$ $cm^{-3}$, with an oxide thickness of 7 nm for insulator 121, and an oxide thickness of 20 nm for insulator 122. The operating voltages for this embodiment are given in Table 1. As a naming convention, the '1' is referred to as a true state.

TABLE 1

|  | bitline | wordline | injector-line | source-line | plate-line |
|---|---|---|---|---|---|
| read | 1 V | 0 V | 0 V | 0 V | 2 V |
| write '0' | 0 V | -4 V | -4 V | 0 V | 4.5 V |
| write '1' | 0 V | -3.2 V | -4 V | 0 V | 4.5 V |
| erase | 4 V | 4 V | 4 V | 4 V | -6 V |
| standby | 0 V | -3 V | 0 V | 0 V | 2 V |

Figure 2:
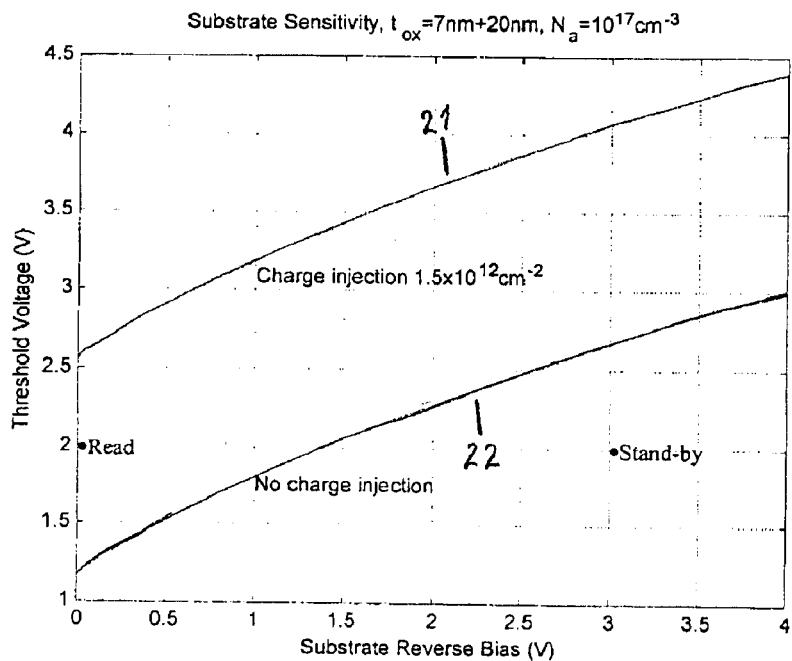
FIG. 2. shows the EEPROM device threshold voltage as a function of the device body voltage.

In FIG. 2 the EEPROM device threshold voltage as a function of the device body voltage is shown for the same as embodiment that gives Table 1. FIG. 2 shows the threshold voltage in the erased state 22 (no injection charge) and in the programmed state 21 (charge injection=$1.5\times10^{12}$ $cm^{-2}$). It clearly indicates that under a common-gate voltage of 2V, the device is turned off in the standby mode by a reverse body-bias of 3V, and the device programmed state can be satisfactorily read with zero body-bias in the read mode.

Figure 3:
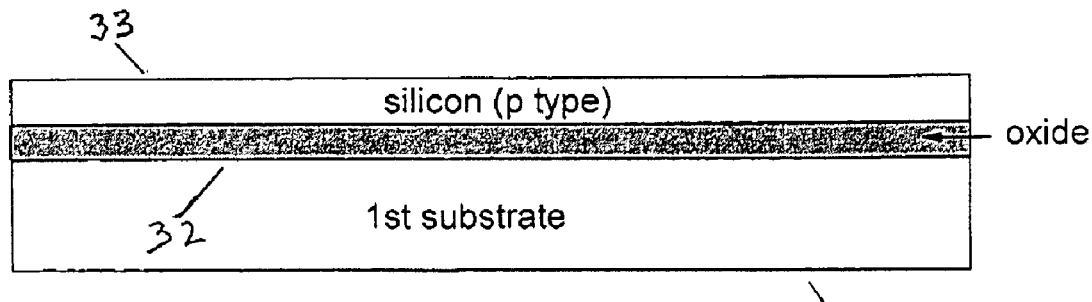
FIGS. 3. to 14. outline the process in cross sectional views for fabricating two adjacent stack gate EEPROM devices in a memory array configuration.

FIGS. 3. to 14. outline the process in cross sectional views for fabricating two adjacent stack gate EEPROM devices in a memory array configuration.

FIG. 3 shows the starting material comprising a silicon-on-insulator (SOI) wafer. It has a first substrate, typically a Si wafer 31, and an insulating layer 32 on top of the substrate, typically $SiO_2$. On top of the insulator there is a high quality Si layer 33. This Si layer, 33, is where devices are being fabricated.

Figure 4:
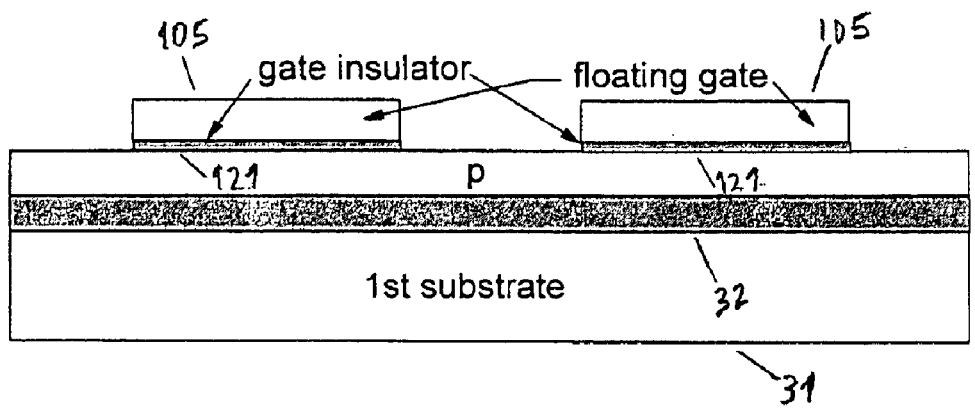
FIG. 4. shows the formation and patterning of the gate insulator and the floating gate.

FIG. 4. shows the formation and patterning of the gate insulator 121 and the floating gate 105. The floating gate is formed from a layer of polysilicon.

Figure 5:
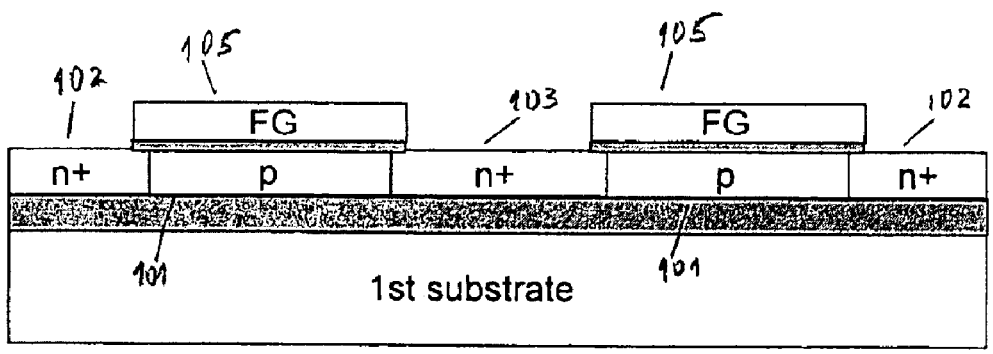
FIG. 5. shows the formation of the heavily doped n-type source and drain regions.

FIG. 5. shows the formation of the heavily doped n-type source 103 and drain 102 regions, using the patterned floating gate as a ion implantation mask. The source 103 and drain 102 are defining the body 101 region.

Figure 6:
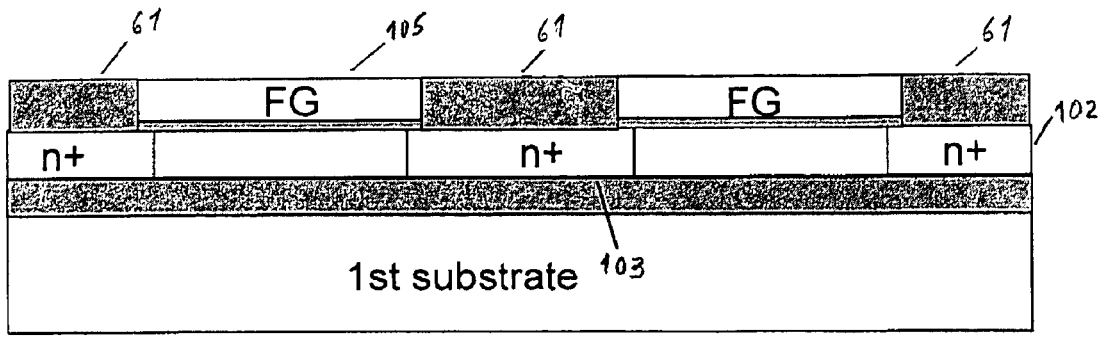
FIG. 6. shows the formation of planarized isolation oxide.

FIG. 6. shows the formation of planarized isolation oxide 61.

Figure 7:
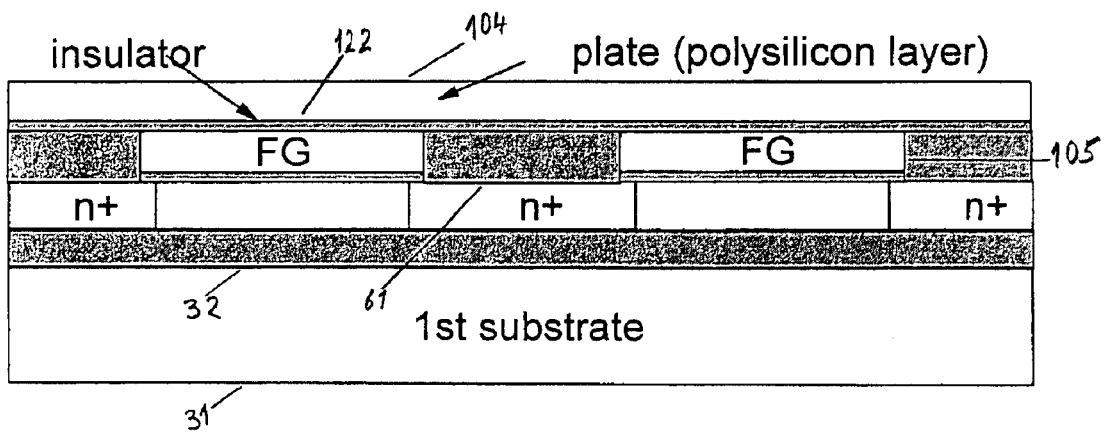
FIG. 7. shows the formation of an insulator layer and a polysilicon layer on top of the floating gate.

FIG. 7. shows the formation of an insulator layer 122 and a polysilicon layer 104 on top of the floating gate 105. This polysilicon layer forms the plate (control gate of the devices) 104 electrode of the memory array.

Figure 7A:
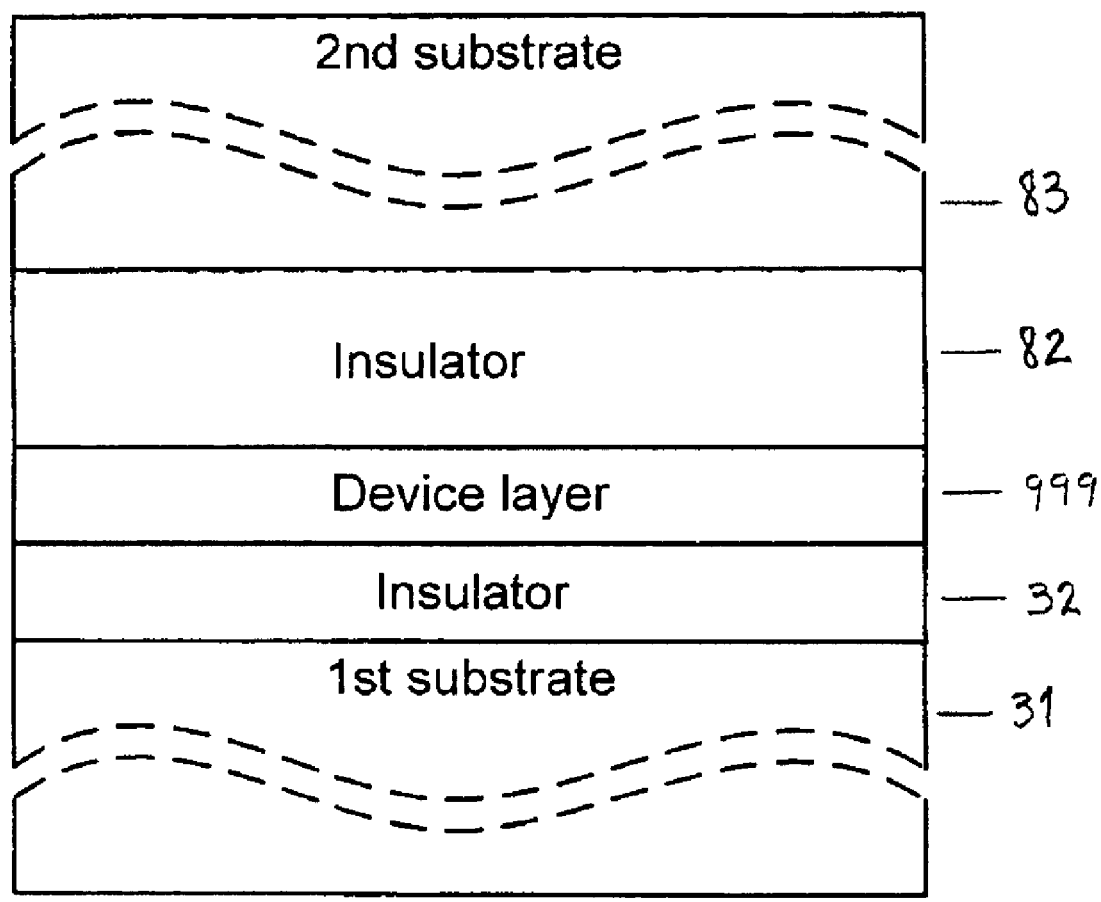
FIG. 7A. illustrates the transferring the device structure layer from a first substrate, or wafer, to a second substrate.

FIG. 7A. shows an illustration of transferring the device structure layer from a first substrate 31, or wafer, to a second substrate 83. Device layer 999 is a multitude of layers at this point of the process, including all the processing shown in FIGS. 3 to 7. This device layer is, by methods known in art, bonded or transferred onto a second insulting layer, typically $SiO_2$ 82. Once the first substrate 31 and insulator 32 are removed, the devices in layer 999 are resting on a new, second, substrate in an up-side-down position in comparison to their position on the first substrate.

There are several ways known in the art that a layer transfer can be carried out, such as the so called SmartCut (a registered trademark of SOITEC Corporation) technique, or the so called ELTRAN (Epitaxial Layer TRANsfer, a registered trademark of Canon K.K.) process, as described in U.S. Pat. No. 5,371,037 to T. Yonehara, titled: "Semiconductor Member and Process for Preparing Semiconductor Member", and further techniques as well. For the embodiments of the present invention any known layer transferring technique or process can be used.

Figure 8:
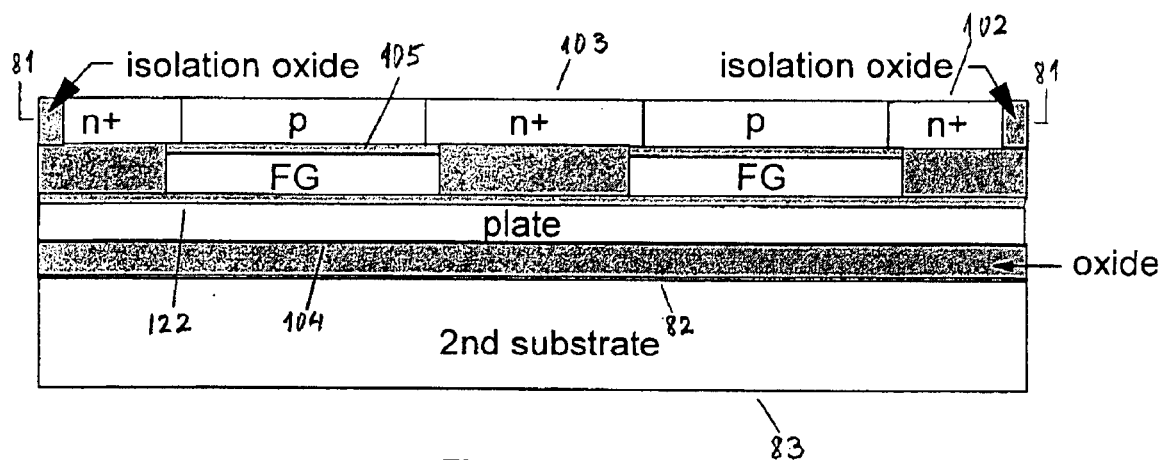
FIG. 8. show illustrates the structure after bonding to another wafer.

FIG. 8. shows the structure after bonding to another, (second) wafer 83, and after the substrate 31 and oxide 32 of the original SOI wafer has been removed after bonding, and after isolation oxide 81 has been formed to isolate the two memory devices from their neighbors. Thus, the silicon that forms the device regions now lie on top of the plate electrode 104 and the floating gate regions 105. The devices are in an up-side-down position in comparison as they were on the first substrate 31.

Figure 9:
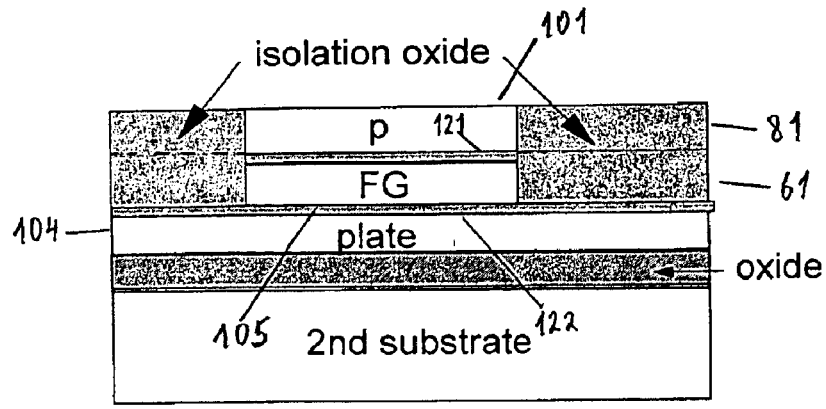
FIG. 9. shows the structure in cross section in the width direction at this stage of the precessing.

FIG. 9. shows the structure in cross section in the width direction at this stage of the processing. It shows that the device body 101 and floating gate 105 of the individual devices are isolated by 61 and 81, but in this embodiment there is a common plate electrode 104 for the memory array. This plate electrode in various embodiments can belong to individual cells, be shared by two cells, or can be shared by a large plurality of cells, for instance by a whole subarray, or even a whole array.

Figure 10:
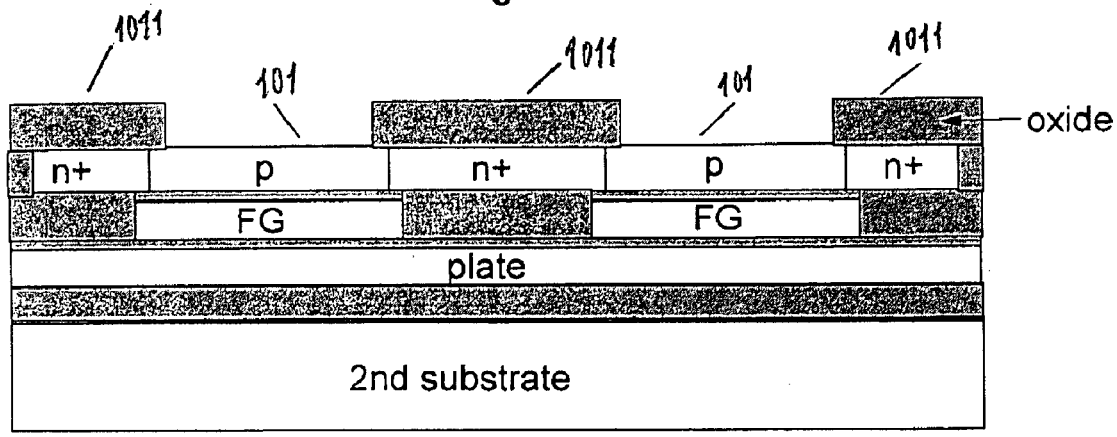
FIG. 10. shows the structure after patterning an oxide layer to expose the device body regions.

FIG. 10. shows the structure after forming and patterning an oxide layer 1011 to expose the device body regions 101.

Figure 11:
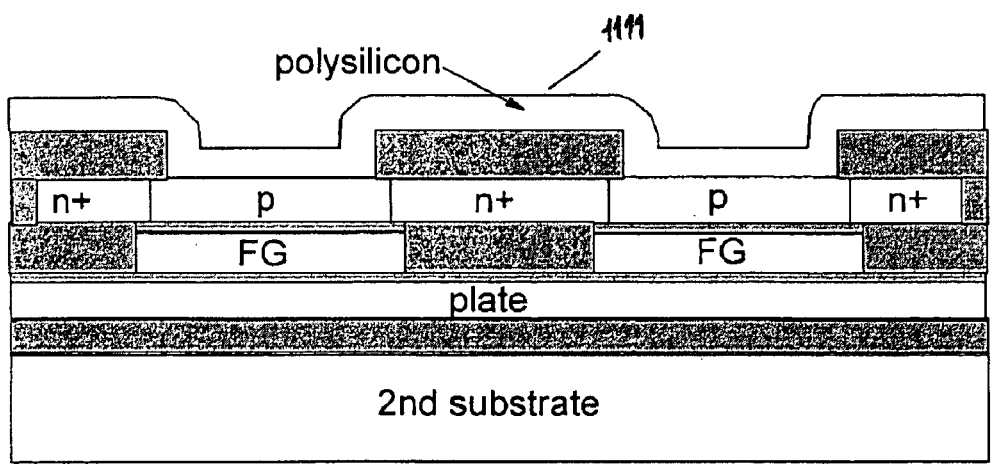
FIG. 11. shows the formation of a polysilicon layer.

FIG. 11. shows the formation of a polysilicon layer 1111. This polysilicon layer will be used to form the heavily n-type doped injector electrode and to form a heavily doped p-type contact to the device body.

Figure 12:
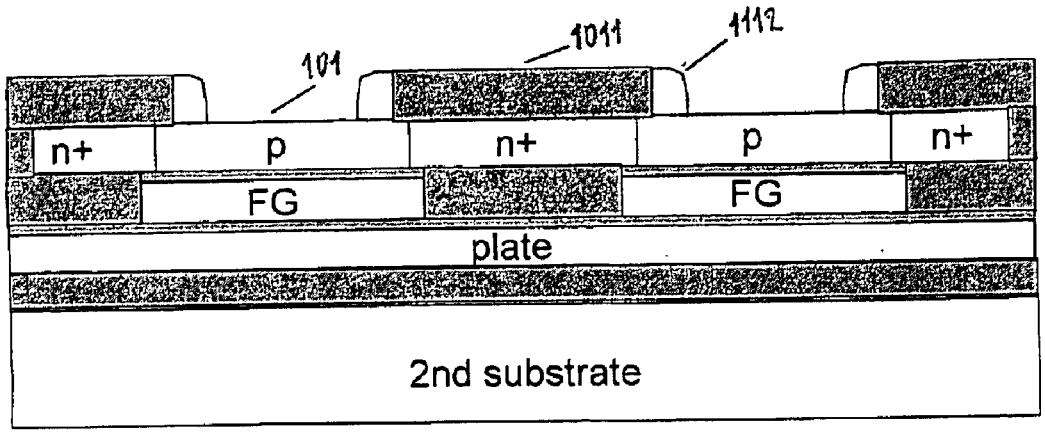
FIG. 12. shows the structure after reactive ion etching of the polysilicon layer.

FIG. 12. shows the structure after reactive ion etching of the polysilicon layer 1111 without using a masking step, showing the polysilicon sidewalls 1112. Alternatively, the polysilicon layer can be patterned using a masking step, but the resulting polysilicon regions will be larger than the sidewalls, leading to a larger device area.

Figure 13:
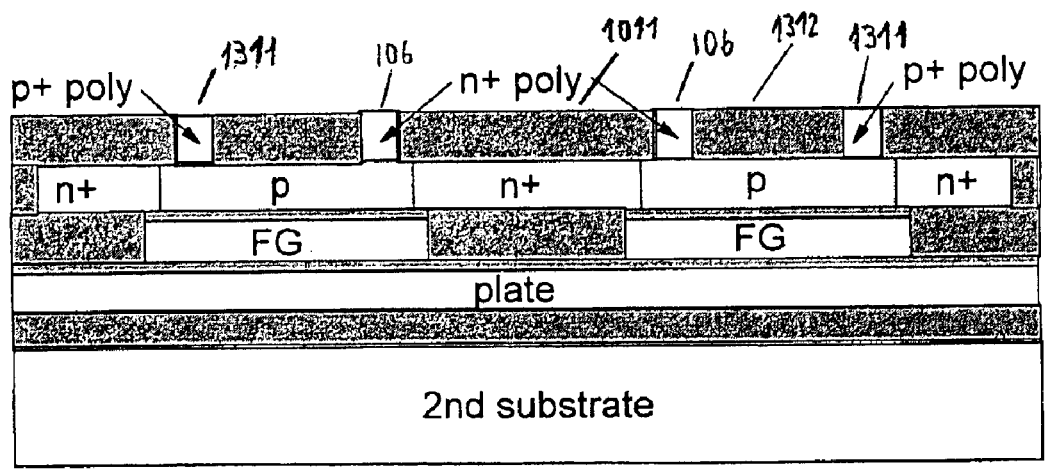
FIG. 13. shows the structure after the deposition of a layer of oxide, planarization of the oxide layer, and doping the polysilicon sidewalls by ion implantation.

FIG. 13. shows the structure after the deposition of a layer of oxide 1312, planarization of the oxide layer, and doping the polysilicon sidewalls by ion implantation. The $p^+$ polysilicon regions are the body contacts 1311, and the $n^+$ polysilicon regions are the electron injectors 106, the means for injecting a programming current in this embodiment.

Figure 14:
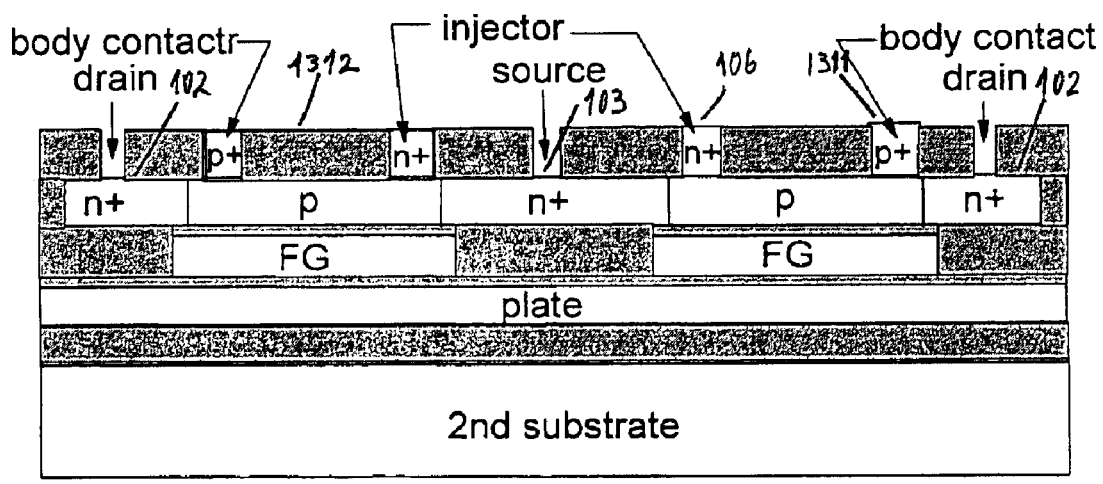
FIG. 14. shows the structure after etching the oxide to form contacts to the source and drain regions.

FIG. 14. shows the structure after etching the oxide 1312 to form contacts to the source 103 and drain 102 regions. It shows that the pair of devices share a common source 103 to minimize device area in an array.

The stack gate device configuration can have an over-erasure exposure. Over-erasure occurs when the erase process results in a net negative amount of charge in the floating gate 105, causing the floating gate to be positively charged and the threshold voltage of the device to be smaller than intended. A split gate device structure embodiment has no exposure to over erasure. In the split gate device structure the device channel is divided into two parts in series, one part is covered by the floating gate 105, and the other by the control gate 104. Thus, even if over-erasure occurs, the device threshold voltage is determined by the control gate part of the device. In all other aspects the stack gate and split gate configuration devices work identically.

Figure 15:
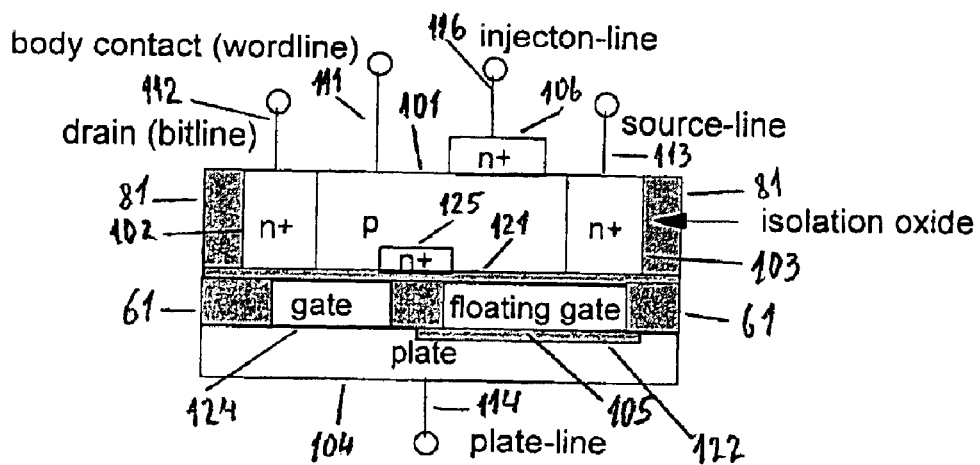
FIG. 15. shows in a cross sectional view one embodiment of the invention, a split gate configuration EEPROM device.

FIG. 15. shows in a cross sectional view one embodiment of the invention, a split gate configuration EEPROM device. The device rests on a plate 104, which is the control gate of the device, and in this embodiment it also extends 124 over part of the body 101. The shallow $n^+$-type region 125 connects the device channel of the floating gate region 105 with the device channel of the gate region 124. Regions 104 and 124, of course, are electrically connected. In the memory array the plate is contacted and controlled by the plate-line 114. In many embodiments the plate is shared by two, or by a plurality of memory cell devices. The plate is isolated from the floating gate 105 by insulator 122. Insulator 122 in a preferred embodiment is $SiO_2$. The floating gate is isolated by another insulator 121, typically $SiO_2$, from the source 103, body 101, and drain 102. Insulators 61 and 81 isolate one device from another device in the gate level and in the body level, respectively. The p-type body is contacted by an $n^+$-type electron injector 106. This arrangement is an embodiment of the injection means, namely as a p-n semiconductor junction. In an EEPROM memory array besides the plate-line 114, further control lines are contacting the device. The bitline 112 contacts the drain 102. The wordline 111 contacts the body 101, since in this device the drain current is being controlled by a voltage between the source and the body. A source-line 113 contacts the source 103, and an injection line 116 contacts the electron injector 106.

Figure 16:
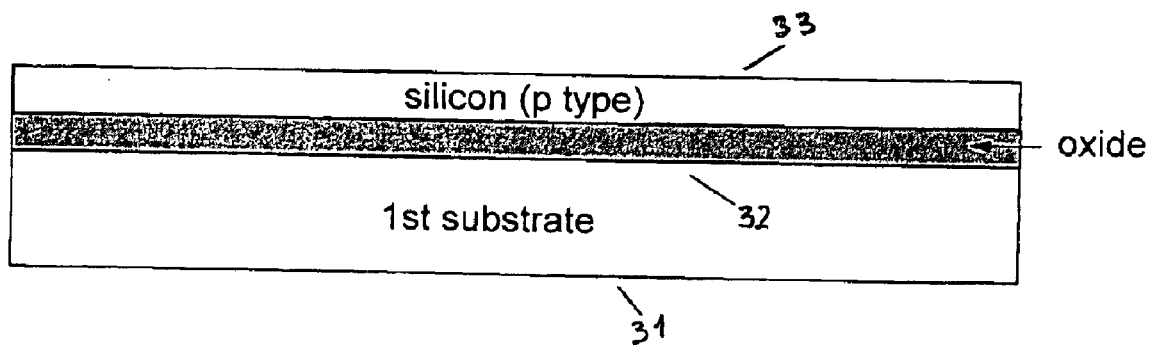
FIGS. 16. to 29. outline the process in cross sectional views for fabricating two adjacent split gate EEPROM devices in a memory array configuration.

FIGS. 16. to 29. outline the process in cross sectional views for fabricating two adjacent split gate EEPROM devices in a memory array configuration.

FIG. 16. shows the starting material comprising an SOI wafer: the first substrate typically a Si wafer 31, the insulating layer 32 on top of the wafer, typically $SiO_2$, and the high quality Si layer on top the insulator 33. This Si layer 33 is the one where devices are being fabricated.

Figure 17:
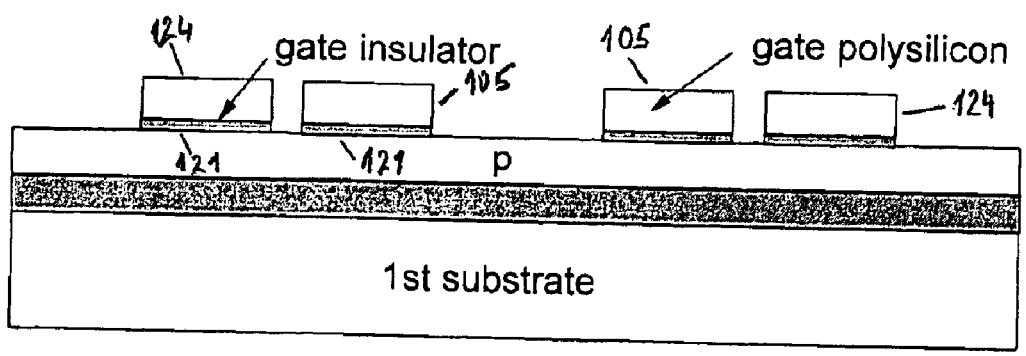
FIG. 17. shows the structure after gate polysilicon and gate insulator have been formed and patterned.

FIG. 17. shows the structure after gate polysilicon and gate insulator 121 have been patterned. Two polysilicon regions will be used in one device, with one polysilicon region forming the floating gate 105 and another polysilicon region forming the gate electrode 124 of the split gate device.

Figure 18:
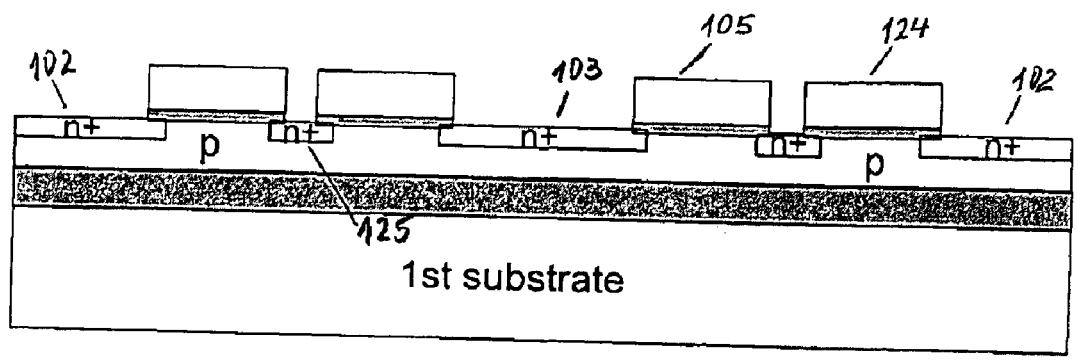
FIG. 18. shows the structure after a shallow heavily doped n-type layer has been formed.

FIG. 18. shows the structure after a shallow heavily doped $n^+$-type source 103 and drain 102 regions, using the patterned floating gate as a ion implantation mask. The shallow $n^+$-type region 125 connects the device channel of the floating gate region 105 with the device channel of the gate region 124.

Figure 19:
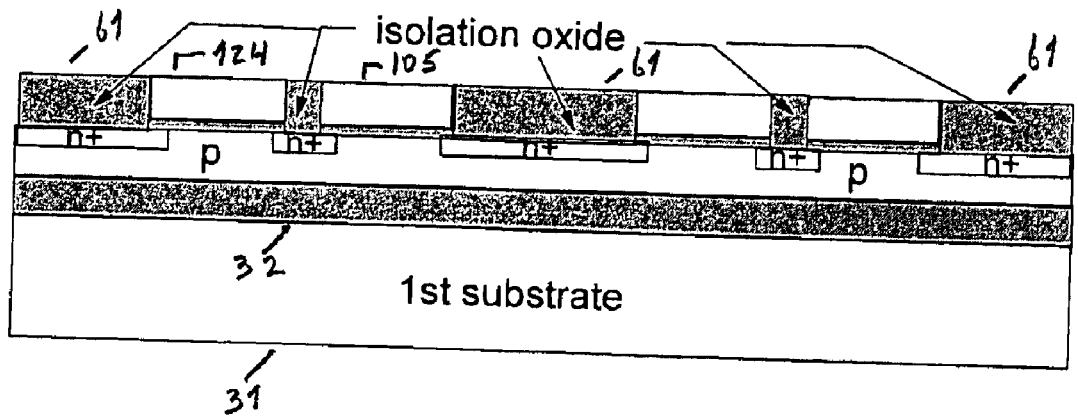
FIG. 19. shows the structure after oxide is deposited and planarized to form isolation regions.

FIG. 19. shows the structure after oxide is formed and planarized to form isolation regions 61.

Figure 20:
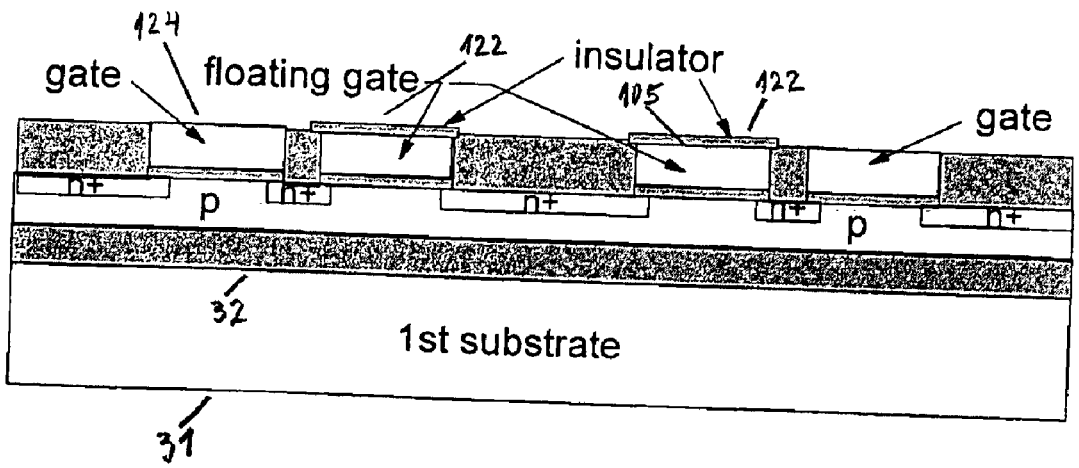
FIG. 20. shows the structure after an insulator layer is formed on the polysilicon regions that form the floating gates.

FIG. 20. shows the structure after an insulator layer 122 is formed on the polysilicon regions that form the floating gates 105. No insulator is formed on the polysilicon regions that form the regular gate electrodes 124.

Figure 21:
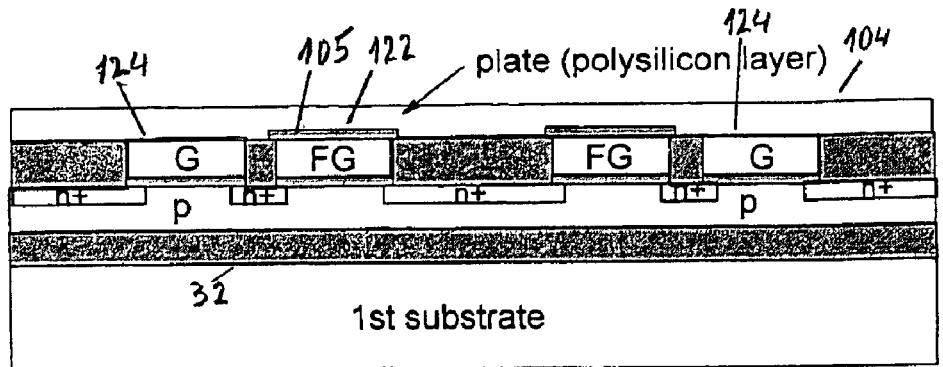
FIG. 21. shows the structure after a layer of polysilicon has been deposited.

FIG. 21. shows the structure after a layer of polysilicon has been deposited 104. This polysilicon layer is in electrical connection to the gate polysilicon regions 124, but is insulated from the floating gate regions 105 by insulator 122. Thus, this polysilicon 104 becomes the control gate of the two split gate devices. In the memory array arrangement, this polysilicon layer functions as a plate electrode, connected to plate-line 114.

The next step is the layer transfer, which occurs for the split gate embodiment in the same manner as for the stack gate embodiment. This step is as illustrated on FIG. 7A, and described in the discussion of FIG. 7A.

Figure 22:
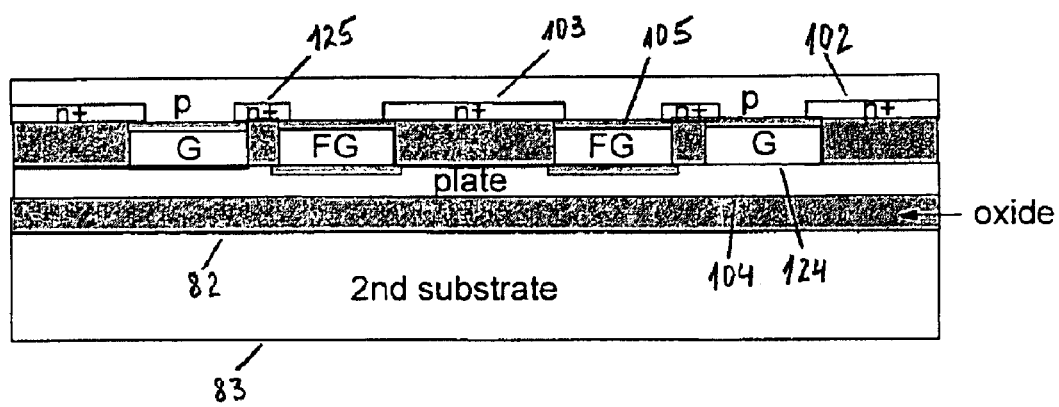
FIG. 22. shows the structure after bonding to a second SOI wafer.

FIG. 22. shows the structure after bonding to another, (second) wafer 83, and after the substrate 31 and oxide 32 of the original SOI wafer has been removed after bonding. Thus, the silicon that forms the device regions now lies on top of the plate electrode 104, the floating gate regions 105 and gate regions 124. The devices are in an up-side-down position in comparison as they were on the first substrate 31.

Figure 23:
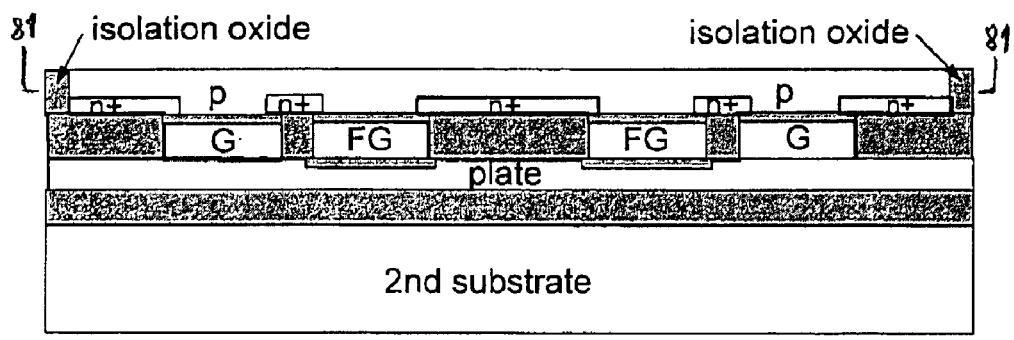
FIG. 23. shows the structure after isolation oxide regions have been formed.

FIG. 23. shows the structure after isolation oxide regions 81 have been formed to isolate the pair of devices from their neighbors in the memory array.

Figure 24:
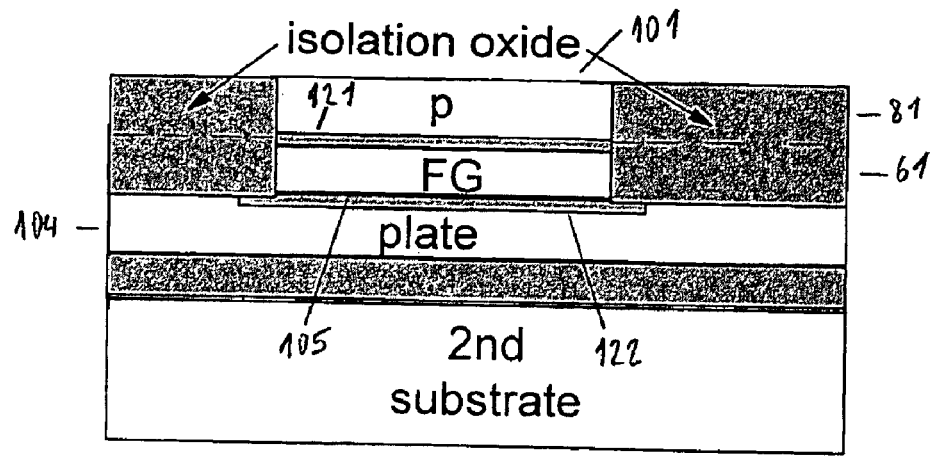
FIG. 24. shows the cross section view along the device width direction of the floating gate region at this stage of the processing.

FIG. 24. shows the cross section view along the device width direction of the floating gate region 105 at this stage of the processing. It shows that the device body 101 and floating gate 105 of the individual devices are isolated by 61 and 81, but in this embodiment there is a common plate electrode 104 for the memory array. This plate electrode in various embodiments can belong to individual cells, be shared by two cells, or can be shared by a large plurality of cells, for instance by a whole subarray, or even a whole array.

Figure 25:
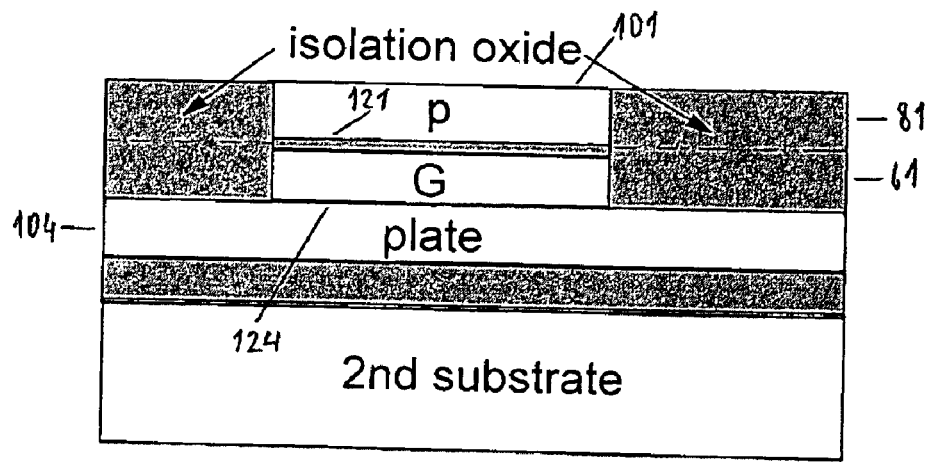
FIG. 25. shows the cross section view along the device width direction of the regular gate region at this stage of the processing.

FIG. 25. shows the cross section view along the device width direction of the regular gate region 124 at this stage of the processing. It shows that the device body 101 is isolated by 61 and 81, but in this embodiment there is a common plate electrode 104, shorted to the gate 124, for the memory array. This plate electrode in various embodiments can belong to individual cells, be shared by two cells, or can be shared by a large plurality of cells, for instance by a whole subarray, or even a whole array.

Figure 26:
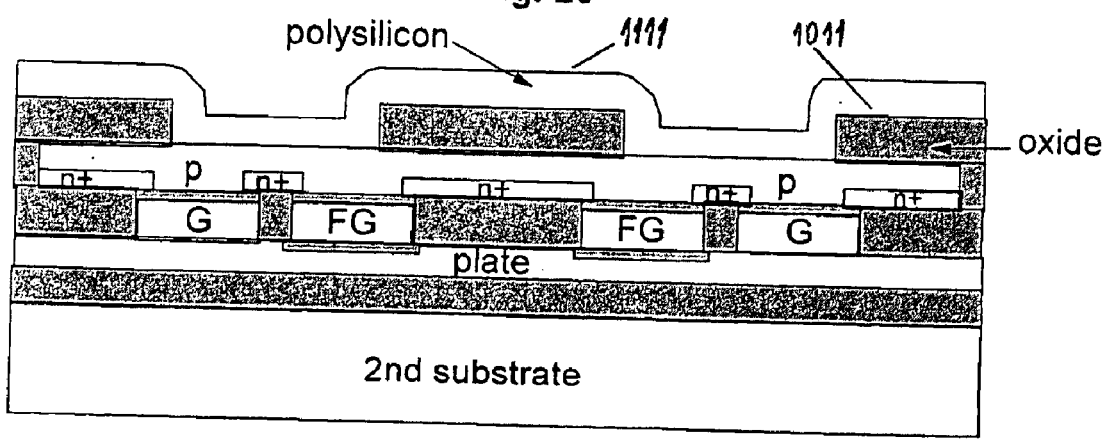
FIG. 26. shows the structure after patterning of an oxide layer and formation of a polysilicon layer.

FIG. 26. shows the forming and patterning an oxide layer 1011, and formation of a polysilicon layer 1111. This polysilicon layer will be used to form the heavily $n^+$-type doped injector electrode and to form the heavily doped $p^+$-type contact to the device body.

Figure 27:
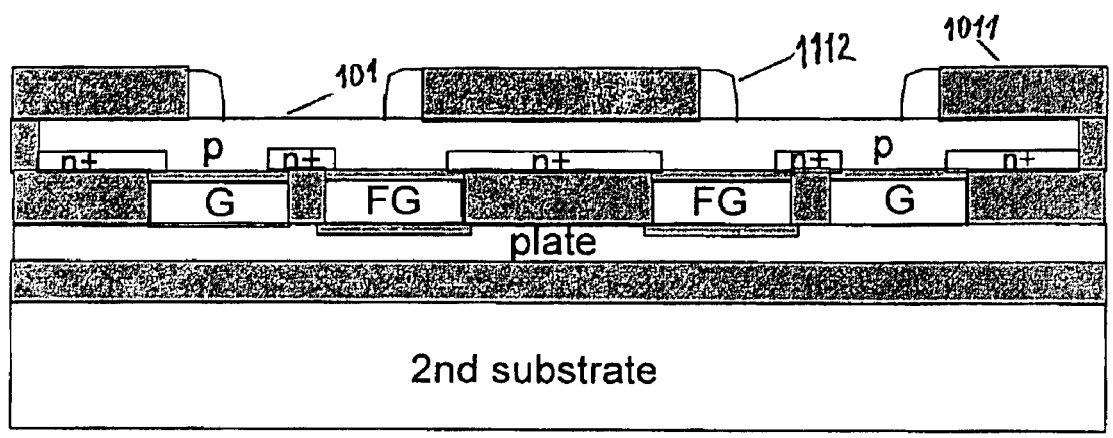
FIG. 27. shows the structure after reactive ion etching of the polysilicon layer.

FIG. 27. shows the structure after reactive ion etching of the polysilicon layer 1111 without using a masking step, showing the polysilicon sidewalls 1112. Alternatively, the polysilicon layer can be patterned using a masking step, but the resulting polysilicon regions will be larger than the sidewalls, leading to a larger device area.

Figure 28:
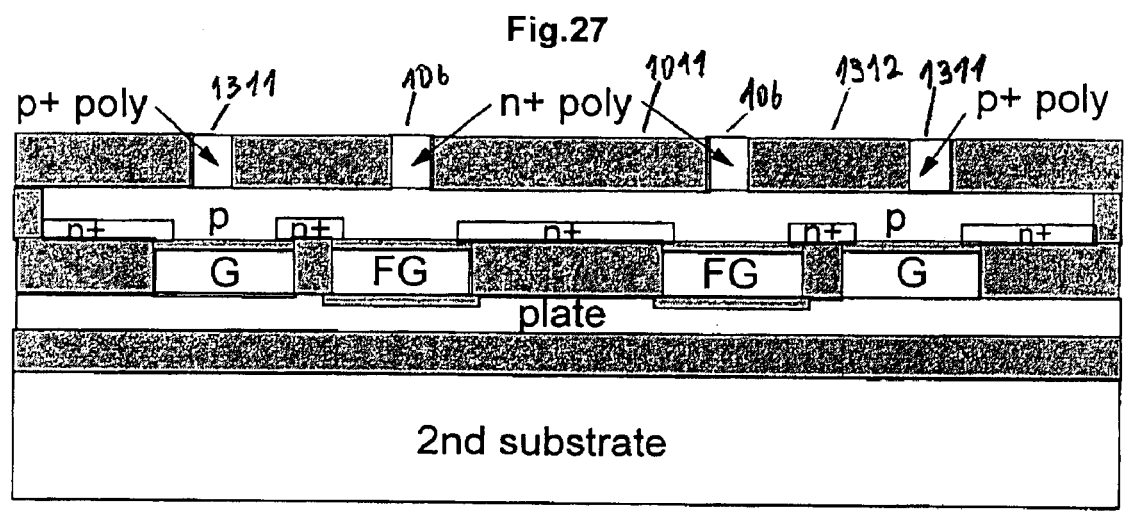
FIG. 28. shows the structure after the deposition of a layer of oxide, planarization the oxide layer, and doping the polysilicon regions by ion implantation.

FIG. 28. shows the structure after the deposition of a layer of oxide 1312, planarization of the oxide layer, and doping the polysilicon sidewalls by ion implantation. The $p^+$ polysilicon regions are the body contacts 1311, and the $n^+$ polysilicon regions are the electron injectors 106, the means for injecting a programming current in this embodiment.

Figure 29:
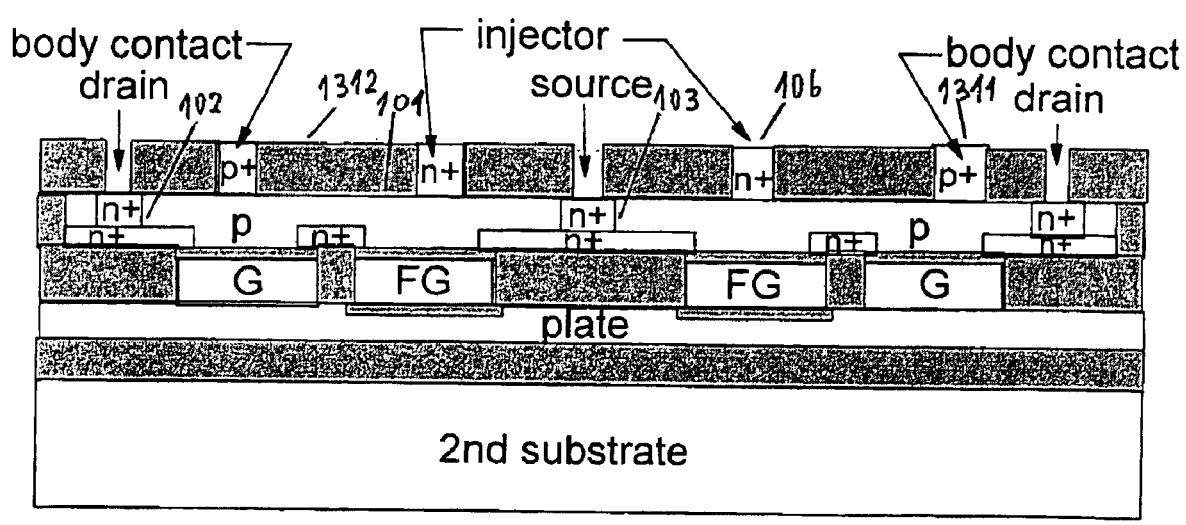
FIG. 29. shows the structure after etching the oxide to form contacts to the source and drain regions.

FIG. 29. shows the structure after etching the oxide 1312 to form contacts to the source 103 and drain 102 regions. It shows that the pair of devices share a common source 103 to minimize device area in an array.

Figure 30:
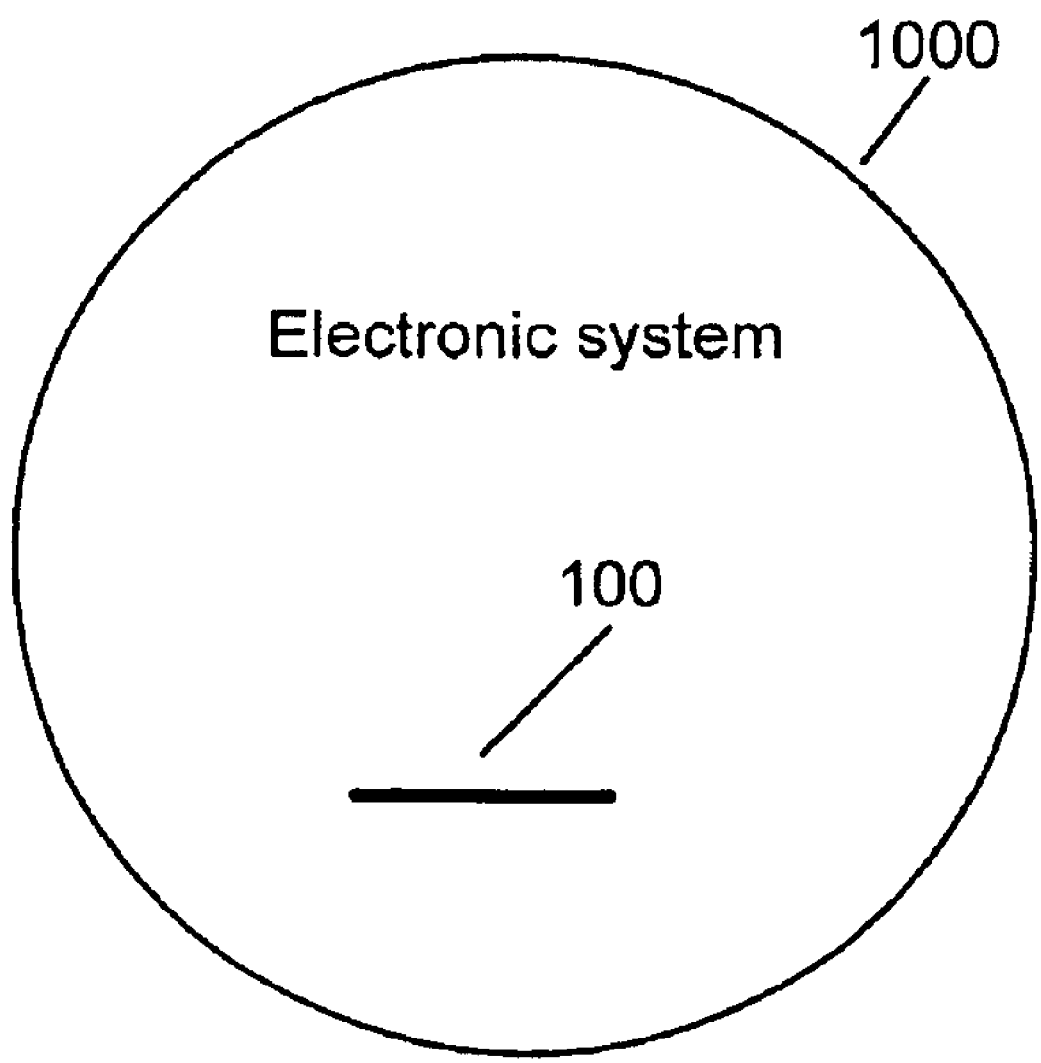
FIG. 30. Schematically shows an electronic system containing an EEPROM array of the present invention as its component.

FIG. 30. Schematically shows an electronic system 1000 containing an EEPROM array 100 of the present invention as its component. The electronic system 1000 can be digital, such as a computing device, or computer, or it can have analog components as well, such as a communication device. Furthermore, any battery operated system, such as a cellphone, portable computer, or sophisticated toy is a system that can take advantage of the present invention. Any electronic system using EEPROM-s can benefit from the herein disclosed device. The availability of such a low powered fast EEPROM will likely spur new applications, as well.

Many modifications and variations of the present invention are possible in light of the above teachings, and could be apparent for those skilled in the art. The scope of the invention is defined by the appended claims.

We claim:

1. An EEPROM device adapted for large scale integration, comprising:
   a body;
   a floating gate isolated from said body and capable of storing charges; and
   a charge injector adapted for injecting a programming current into said body, wherein said programming current is of the same type as said charges stored by said floating gate.

2. The device of claim 1, further comprising a source and a drain, wherein a drain current is being controlled by a voltage between said source and said body.

3. The device of claim 2, wherein said device being implemented with a stack gate configuration.

4. The device of claim 2, wherein said device being implemented with a split gate configuration.

5. The device of claim 1, wherein said device being fabricated by a SOI technology.

6. The device of claim 1, wherein said device being fabricated by a thin film technology.

7. The device of claim 1, wherein said body is a p-type semiconductor and said programming current consists essentially of electrons.

8. The device of claim 1, wherein said body is an n-type semiconductor and said programming current consists essentially of holes.

9. The device of claim 1, wherein said charge injector is a semiconductor p-n junction.

10. The device of claim 1, wherein said charge injector is a metal-semiconductor Schottky barrier junction.

11. The device of claim 1, wherein said charge injector is a tunneling junction across an insulating barrier.

* * * * *